Oct. 6, 1959

M. C. LUTTON 2,907,924

ELECTRICAL ASSEMBLY

Filed Sept. 1, 1955

INVENTOR.

Melvin C. Lutton

BY

Donald P. Smith

Attorney

United States Patent Office 2,907,924

Patented Oct. 6, 1959

2,907,924

ELECTRICAL ASSEMBLY

Melvin C. Lutton, Silver Spring, Md., assignor to ACF Industries, Incorporated, New York, N.Y., a corporation of New Jersey Application September 1, 1955, Serial No. 532,058

6 Claims. (Cl. 317—101)

In recent years the growing complexity of the electronic arts has given rise to a number of new techniques for the rapid production of circuits. Among these may be mentioned printed circuitry wherein, as is known, an array of conductors are formed on an insulating planar surface by any one of a number of known methods, and electrical components are secured to the surface in bridging relation to hiatuses in the conductors whereby a circuit is established. The modular technique has also been developed as a preferred form of circuit construction. One type of module consists of a plurality of ceramic wafers or plates arranged parallel, one to another, and held fixed by means of conductive risers piercing the edges of the ceramic plates and soldered thereto. The purpose of the plates is to provide surfaces on which to accommodate electrical components, and the conductive risers are to afford conductors to interconnect the same with the conductors on the beforementioned planar surface. It has been found desirable to secure a module to a circuit panel member by forming an aperture in the panel and passing the assemblage of conductive risers through such aperture whereafter they are bent back upon themselves to engage against the terminals of the conductors at the edge of the aperture. If the module carries on its top a tube socket then the socket extends through the aperture and the tube is disposed on one side of the planar surface and the stack of plates is disposed on the other side.

This invention is concerned primarily with one portion of the above discussed module, namely a plate thereof but is not necessarily limited thereto as many modifications may be made by those skilled in the art once the basic principle is revealed. It has been found extremely useful to provide conductive paths on the supporting face of the module wafers to interconnect between the terminals of the components thereon. An example of this is illustrated when the module carries a socket on the top plate thereof and it is desired to interconnect two or more of the socket contacts; then if a conductive path be formed on the wafer surface such path will form a circuit between the several contacts thereby connecting them at the same potential, as is desired, and eliminating the necessity for individual connection to the riser wires thus saving those wires for use in interconnecting other component terminals to the external circuit carried by the planar member. The invention herein, as will be more fully explained, contemplates the forming of conductive paths on all surfaces and edges of a member which paths may reach over the edges to be continuous on both faces. This latter species allows the use of a conductive path as a shielding device, as will later be apparent.

It is accordingly a broad object of this invention to improve on the circuit assemblies now in use.

It is another object of this invention to provide a planar circuit assembly support having conductive paths on the several faces and edges.

It is a further object of this invention to provide a novel modular assembly wherein conductive paths are provided on the several wafers forming such module.

It is a further and more distinct object of this invention to provide conductive paths on either or both faces of a module wafer whereby to interconnect between components.

Other objects and advantages will be in part obvious and in part pointed out in the following specification taken into connection with the drawing in which.

Figures 1, 2, 3, 4:
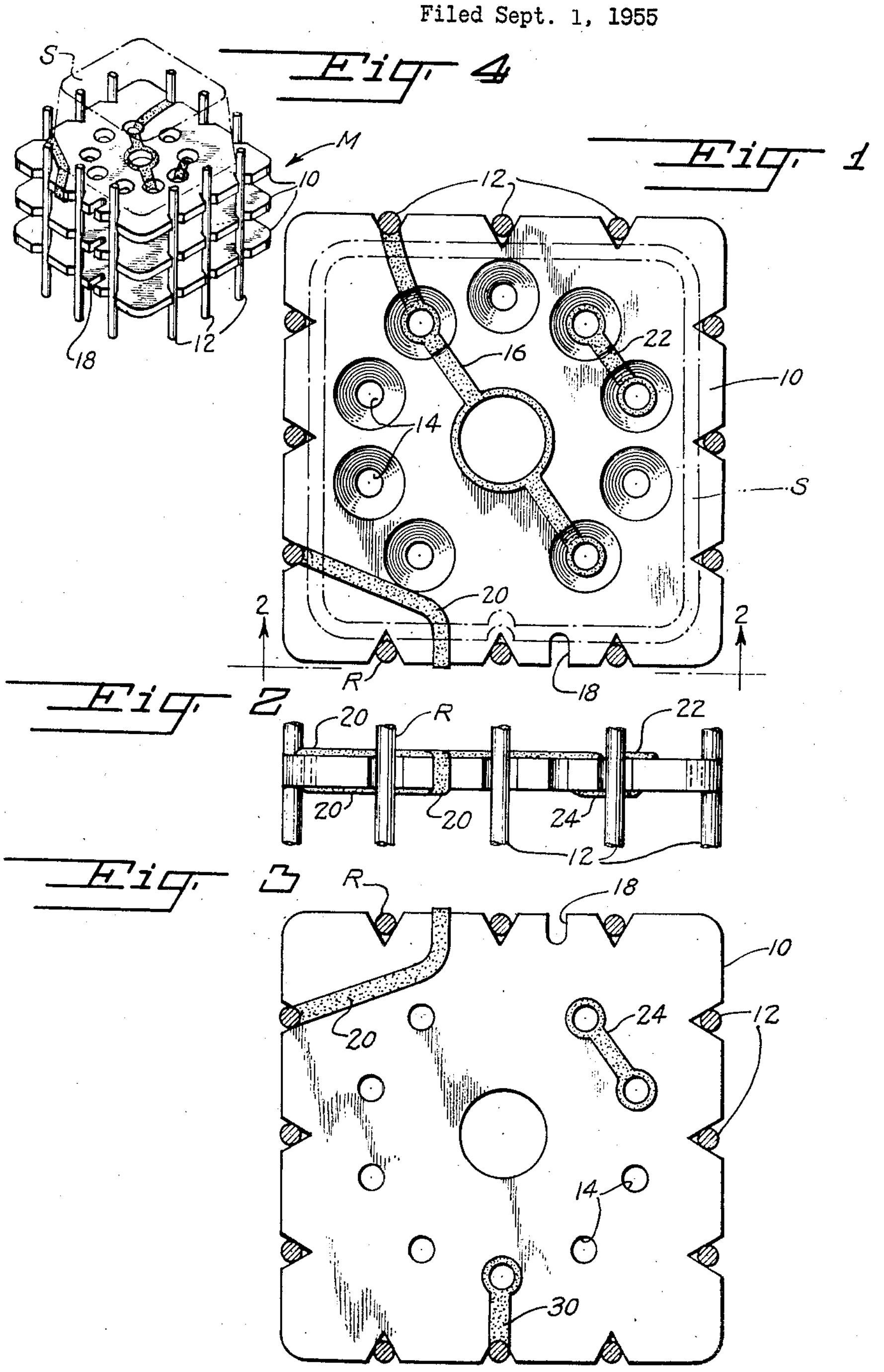
Figure 1 is a top plan view of a modular assembly showing the superior wafer carrying printed circuitry.
Figure 2 is a side elevation of the wafer of Figure 1 taken on line 2—2 and looking in the direction of the arrows.
Figure 3 is a bottom view of the wafer shown in Figure 1.
Figure 4 is a perspective view of a module embodying this invention.

Referring now to the drawing wherein like reference characters designate like or corresponding parts throughout, a module M is illustrated in Figure 4 to consist of a plurality of wafers or plate members 10 held in spaced apart relation by an assemblage of conductive wires 12, the wires being disposed in piercing relation at the edges of the plates to rest in a series of kerfs formed therein. In the final assembly step the wires are soldered or otherwise bonded into the kerfs and are thus securely held thereto. An orienting notch 18 is formed in one edge of each wafer and is used throughout various subassembling processes to place the wafers in a known position whereby the supported components may be accurately connected. A socket S will be seen in phantom outline resting on the top wafer of the module. As shown, the assembly of Figure 4 is in condition for fixing or securing into external wiring and is used to form a complete stage of a multistage electronic circuit, the several disclosed wafers serving to support electrical components such as inductors, resistors, condensers, or the like and the superior wafer carrying the socket and tube. As can be seen this is an extremely versatile structure and represents a material step forward in the miniaturization of electrical circuitry.

Referring now to Figure 1, reference character 10 indicates a wafer which may be any one of the several wafers disclosed in the embodiment of Figure 4, or any planar member, but in this case the top-most or superior wafer is selected for illustration. The tube socket S is there shown in phantom outline. Disposed about the periphery are formed a series of kerfs which receive therein a series of riser wires 12 to be bonded thereto by soldering or any other suitable means. A number of holes 14 are formed in the wafer to accept the socket contacts which are permitted to pass through the wafer and may be bent back on the other side or secured in any desirable manner to mechanically and electrically hold the socket onto the wafer. An array of printed paths is formed on the wafer, as an example path 16 is shown connected from the upper left hand riser wire to the periphery of the number 4 socket contact pin apertured and then to the periphery of the central socket shield aperture and thereafter to the periphery of the number 9 pin aperture. Printed path 22 is another illustration and communicates between tube contact apertures 6 and 7 to interconnect the contacts received therein.

If it is desirable or necessary to shield a given riser or conductor from an adjacent conductor as is frequently the case in radio frequency circuitry, then a printed path such as 20 may be connected to a riser wire as shown, which is assumed to be grounded, and is formed to run over the top face of the wafer and to reach over the edge thereof (Figure 2) and extend back (Figure 3) to be reconnected to the riser thus surrounding riser R. It will be seen that riser R is effectively shielded from all other components on the wafer surface.

Referring now to Figure 3 it is seen that the bottom of the wafer carries additional printed paths. Conductive path 24 is shown interconnecting contact pins apertures 8 and 9; and conductive path 30 is shown interconnecting between contact pin 5 and adjacent riser wire to thereby connect a tube electrode into the external circuit.

As will be readily appreciated the disclosed method of interconnecting wafer supported components is extremely versatile and can be used in such applications as for example dividing or tapping off a portion of a resistor. If a resistor is printed or otherwise applied to the wafer face and extends between two riser wires any number of printed paths may be connected to selected portions of the resistor and brought to adjacent riser wires or to other component terminals to thereby connect portions of the resistor as a potential divider into external circuits. The same method may be used as a tap for an inductor or a transformer coil.

As another example of the versatility of this novel construction, it frequently happens that a riser wire is severed between two adjacent plate members to open a circuit and isolate a component. If there be additional supported components that must be connected, then a conductive path formed on the edge of the plate member and running between the opened riser and an adjacent one will serve to selectively connect the units as desired. It will be seen therefore that the invention contemplates the use of printed paths on any surface of a plane member and including the edges thereof for interconnecting components and for necessary shielding.

I claim:

1. A module assembly comprising a dielectric wafer sheet having a pair of closely spaced parallel planar surfaces, a plurality of spaced terminal elements fixed to said wafer, one of said terminal elements adapted to be connected to ground, and a conductive circuit coating extending as a continuous conductive strip over said planar surfaces and one edge of said wafer sheet, said conductive strip having both ends thereof connected to said one terminal element, and said conductive strip extending between two of said terminal elements to form a shield therebetween.

2. A module assembly comprising a dielectric wafer sheet having a pair of closely spaced planar surfaces and an edge portion connecting said surfaces, a pair of riser wires fixed to said edge portion of said wafer sheet, one of said riser wires adapted to be connected to ground, and a printed circuit coating on selected portions of said spaced planar surfaces, said printed circuit coating including a continuous conductive strip having both ends thereof connected to said one riser wire and extending over said planar surfaces and said edge portion of said wafer sheet, said conductive strip being positioned between the other one of said riser wires and other portions of said printed circuit coating to form a shield therebetween.

3. An electrical assembly comprising a dielectric wafer sheet having a pair of closely spaced planar surfaces and an edge portion connecting said surfaces, a pair of terminals fixed to said edge portion of said wafer sheet, one of said terminals adapted to be connected to ground, and a printed circuit coating on selected portions of said spaced planar surfaces, said printed circuit coating including a continuous conductive strip having one end thereof connected on one of said wafer surfaces to said one terminal and the other end thereof connected on the other one of said wafer surfaces to said one terminal, said conductive strip extending over said planar surfaces and said edge portion of said wafer sheet, said conductive strip being positioned between the other one of said terminals and other portions of said printed circuit coating to form a shield therebetween.

4. An electrical assembly comprising a dielectric wafer sheet having a pair of closely spaced planar surfaces and an edge portion connecting said surfaces, a pair of terminals fixed to said wafer sheet, one of said terminals adapted to be connected to ground, a plurality of apertures in one surface of said wafer surfaces and adapted to receive socket contacts therein, and a printed circuit coating on selected portions of said pair of spaced planar surfaces, said printed circuit coating including a continuous conductive strip having both ends thereof connected to said one terminal and extending on both of said planar surfaces and across said edge portion of said wafer sheet, said conductive strip being positioned between the other of said terminals and said plurality of apertures to form a shield therebetween.

5. An electrical assembly comprising a dielectric wafer sheet having a pair of closely spaced planar surfaces and an edge portion connecting said surfaces, a pair of terminals fixed to said edge portion of said wafer sheet, one of said terminals adapted to be connected to ground, a plurality of apertures extending through said wafer and between said wafer surfaces to receive socket contacts therein, and a printed circuit coating on selected areas of said spaced planar surfaces, said printed circuit coating including portions joining the peripheries of said apertures and a separate continuous conductive strip having both ends thereof connected to said one terminal and extending on both of said planar surfaces and across said edge portion of said wafer sheet, said conductive strip being positioned between the other of said terminals and said circuit coating portions joining said apertures to form a shield therebetween.

6. A module assembly comprising a dielectric wafer sheet having a pair of closely spaced planar surfaces and an edge portion connecting said surfaces, a plurality of riser wires fixed to said wafer sheet, a first one of said riser wires adapted to be connected to ground, a conductive printed circuit coating on selected areas of said spaced planar surfaces, said printed circuit coating including one portion thereof connected to a second one of said riser wires and a second separate portion formed as a continuous conductive strip having both ends thereof connected to said first one of said riser wires and extending over said planar surfaces and said edge portion of said wafer sheet, said conductive strip being positioned between a third one of said riser wires and said printed circuit coating on said selected surface areas to form a shield therebetween.

References Cited in the file of this patent

UNITED STATES PATENTS

| | | |
|---|---|---|
| 2,493,199 | Khouri | Jan. 3, 1950 |
| 2,593,479 | Nieter | Apr. 22, 1952 |
| 2,771,663 | Henry | Nov. 27, 1956 |
| 2,788,471 | Fulmer | Apr. 9, 1957 |
| 2,812,471 | Jarboe | Nov. 5, 1957 |

OTHER REFERENCES

Radio-Electronics, December 1953, pp. 59 and 60, an article: Project Tinkertoy by Steven Michaels.